US 7,799,676 B2

(12) United States Patent
Chen (10) Patent No.: US 7,799,676 B2
(45) Date of Patent: Sep. 21, 2010

(54) METHOD OF MANUFACTURING A CONTACT STRUCTURE TO AVOID OPEN ISSUE

(75) Inventor: Yinan Chen, Taipei (TW)

(73) Assignee: Nanya Technology Corp. (TW)

( * ) Notice: Subject to any disclaimer, the term of this patent is extended or adjusted under 35 U.S.C. 154(b) by 70 days.

(21) Appl. No.: 11/736,374

(22) Filed: Apr. 17, 2007

(65) Prior Publication Data

US 2008/0194101 A1    Aug. 14, 2008

(30) Foreign Application Priority Data

Feb. 13, 2007  (TW) .............................. 96105195 A (51) Int. Cl.
*H01L 21/4763* (2006.01)

(52) U.S. Cl. ..................... 438/643; 438/637; 438/641; 438/642; 438/672; 438/675; 438/681; 438/685

(58) Field of Classification Search ................ 438/637, 438/641, 642, 643, 648, 672, 675, 676, 681, 438/685, FOR. 355

See application file for complete search history.

(56) References Cited

U.S. PATENT DOCUMENTS

| 6,780,739 | B1 | 8/2004 | Mao et al. |
| 6,815,368 | B2 * | 11/2004 | Chen ........................... 438/751 |
| 2003/0094643 | A1 * | 5/2003 | Yang ........................... 257/296 |
| 2005/0106887 | A1 * | 5/2005 | Chen et al. .................. 438/706 |
| 2005/0250314 | A1 * | 11/2005 | Park ............................ 438/627 |
| 2006/0145242 | A1 * | 7/2006 | Takagi et al. ................ 257/315 |

FOREIGN PATENT DOCUMENTS

TW            92128778         10/1992

* cited by examiner

*Primary Examiner*—N Drew Richards
*Assistant Examiner*—Joannie A Garcia
(74) *Attorney, Agent, or Firm*—Ingrassia Fisher & Lorenz, P.C.

(57) ABSTRACT

A method of manufacturing a contact structure to avoid open issue is provided. The method includes the steps of providing a substrate with a contact region, forming an insulating layer to cover the substrate, forming a contact hole in the insulating layer to expose the contact region, conformally depositing a titanium layer on the insulating layer, conformally depositing a titanium nitride layer on the titanium layer, and performing a plasma process on the titanium nitride layer to remove the impurities in the titanium nitride layer.

5 Claims, 8 Drawing Sheets

METHOD OF MANUFACTURING A CONTACT STRUCTURE TO AVOID OPEN ISSUE

CROSS REFERENCE TO RELATED APPLICATIONS

This application claims priority to Taiwan Patent Application No. 096105195 entitled "Method of Manufacturing a Contact Structure to Avoid Open Issue", filed on Feb. 13, 2007.

FIELD OF INVENTION

The invention is related to a method of manufacturing a contact structure, especially to a method of manufacturing a contact structure to avoid open circuit failure.

BACKGROUND OF THE INVENTION

During the process of manufacturing semiconductor devices, numerous contact structures are required to be formed. For the dynamic random access memory (DRAM), the contact structures include bit-line contact vias, substrate contact vias, gate contact vias, and etc. Through these contact vias, the conductive lines contacted to the source/drain, the substrate, and the gate can be formed. For example, the methods of manufacturing the above structures have been disclosed in U.S. Pat. No. 6,780,739 and Taiwan Patent Application 92128778.

In the current silicon process, a titanium nitride layer, which is generally formed by chemical vapor deposition process, is often used as a diffusion barrier layer. For example, a titanium layer and a titanium nitride layer are deposited prior to filling the bit-line contact hole with metal. However, the impurities may be implanted into the titanium nitride layer during the deposition, affects the conductivity of the titanium nitride layer and even results in open circuit failures.

Therefore, it is necessary to provide a method of manufacturing a contact structure to solve the open circuit issue.

SUMMARY OF THE INVENTION

In light of the drawbacks of the prior art, the present invention provides a method of manufacturing a contact structure to avoid the open circuit failure.

According to one aspect of the present invention, a method of manufacturing a contact structure to avoid open circuit failure is provided. The method includes the following steps: providing a substrate having a contact region; forming an insulating layer to cover the substrate; forming a contact hole in the insulating layer to expose the contact region; conformally depositing a titanium layer on the insulating layer; conformally depositing a titanium nitride layer on the titanium layer; and performing a plasma process on the titanium nitride layer to remove impurities in the titanium nitride layer. According to another aspect of the present invention, the method further includes repeating the steps of depositing the titanium nitride layer and performing the plasma process.

According to still another aspect of the present invention, the step of depositing the titanium layer further includes depositing the titanium layer by an ion metal plasma deposition. The step of depositing the titanium nitride layer includes depositing the titanium nitride layer by a metal-organic chemical vapor deposition (MOCVD). The plasma process further includes using a plasma source gas including $O_2$ or $O_3$.

According to still another aspect of the present invention, a method of manufacturing a contact structure to avoid open circuit failure includes the following steps: providing a substrate having a contact region; forming an insulating layer to cover the substrate; forming a polysilicon layer on the insulating layer; forming a contact hole in the polysilicon layer and the insulating layer to expose the contact region; conformally depositing a titanium layer on the polysilicon layer and in the contact hole; conformally depositing a first titanium nitride layer on the titanium layer; performing a plasma process to the first titanium nitride layer; conformally depositing a second titanium nitride layer on the first titanium nitride layer; performing the plasma process to the second titanium nitride layer; and performing an anneal process.

BRIEF DESCRIPTION OF THE PICTURES

The present invention is illustrated by way of example and not intended to be limited by the figures of the accompanying drawing, in which like notations indicate similar elements.

DETAILED DESCRIPTION OF THE INVENTION

The present invention discloses a method of manufacturing a contact structure to avoid open circuit failures, which have been described with reference to FIGS. 1-14. Any apparatus, devices, material, and steps described in the embodiments are used to describe the invention, and should not be construed in a limiting sense.

Figure 1:
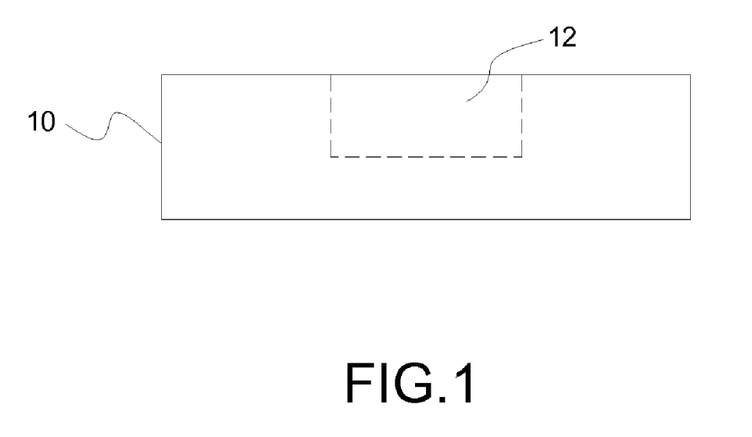
FIGS. 1-4 are flowcharts, in cross-sectional views, illustrating the process of manufacturing a contact structure in accordance with the method of the present invention.
Figure 2:
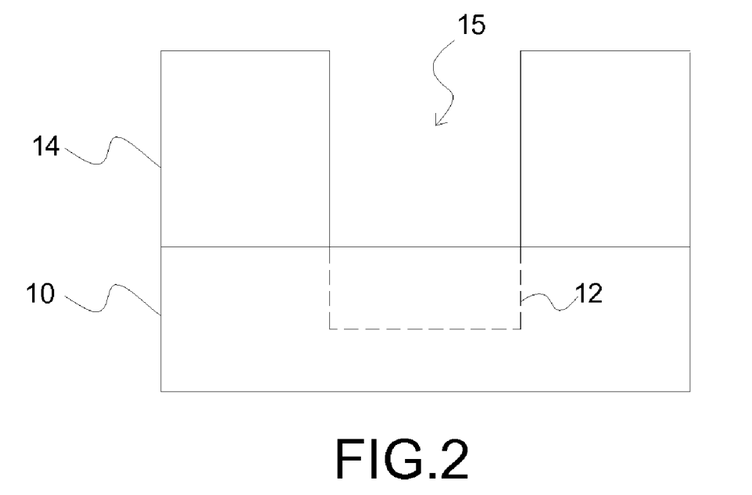

FIGS. 1-4 are flowcharts, in cross-sectional views, illustrating the process of manufacturing a contact structure in accordance with the method of the present invention. Referring to FIG. 1, in one embodiment of the present invention, a substrate 10 including a contact region 12 is provided. The substrate 10 may be any adequate semiconductor substrate or the known silicon wafer, or any substrate which needs to be built with contacts during the semiconductor process. Next, as shown in FIG. 2, an insulating layer 14 is formed on the substrate 10. For example, the insulating layer 14 can be borophosphosilicate glass (BPSG), tetraethoxysilane (TEOS), or the combination thereof. Then, a contact hole 15 is formed in the insulating layer 14 to expose the contact region 12. The contact hole 15 can be formed by conventional photolithography and etching processes, which may include, for example, coating a photoresist layer on the insulating layer 14, patterning the photoresist layer by a pattern transferring technique (such as exposure and development processes) to define the location of the contact hole 15, and etching the insulating layer 14 by using the patterned photoresist layer as a mask.

Figure 3:
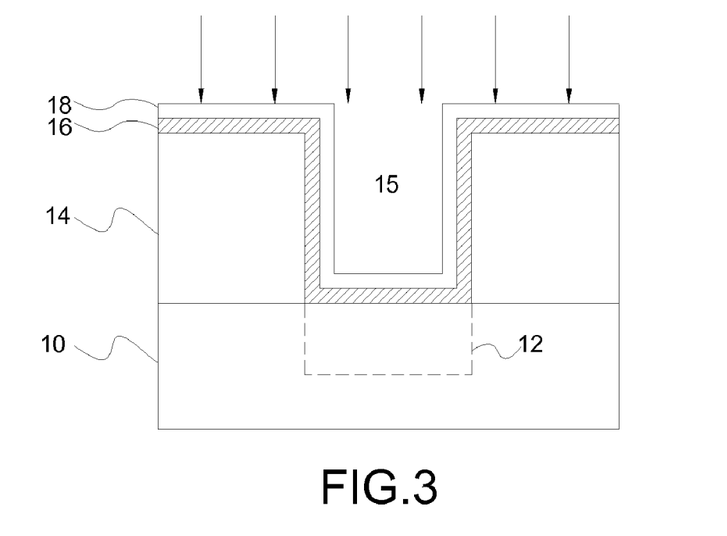
Figure 4:
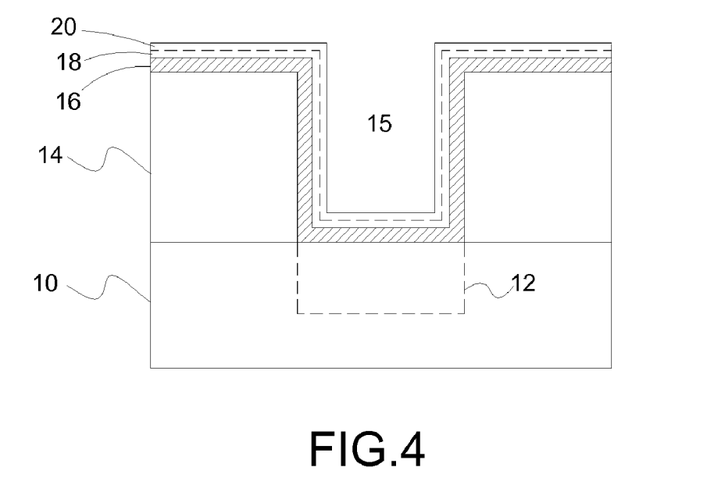

Next, referring to FIG. 3, a titanium layer 16 is conformally formed on the insulating layer 14 and the surface of the contact hole 15 by, for example, an ion metal plasma deposition process. Then, a titanium nitride layer 18 is conformally formed by, for example, a metal-organic chemical vapor deposition (MOCVD) process. A plasma process (the arrow shown in FIG. 3) is performed on the titanium nitride layer 18 to remove impurities (such as carbon) in the titanium nitride layer 18. The plasma source gas used in the plasma process includes $O_2$ and/or $O_3$. After the plasma process, another titanium nitride layer 20 is deposited and the plasma process is performed again on the titanium nitride layer 20, as shown in FIG. 4. The steps shown in FIG. 4 can be repeated for any given times, according to applications. In other words, the resultant titanium nitride layer in the present invention is formed by depositing several thin titanium nitride layers, and the impurities can be removed more effectively by performing the plasma process to each thin titanium nitride layer individually. Afterward, a conductive layer (not shown) is deposited on the titanium nitride layer 20. Since the impurities in the titanium nitride layer 20 are removed by the plasma process, the open circuit failure between the conductive layer and the contact region 12 can be avoided, and the ohmic contact between these two layers can be improved.

The method of the present invention can be applied to form various contact structures on a substrate. Taking the bit-line structure of the dynamic random access memory (DRAM) as an example, the present method can be used to form the source/drain contact. For the word-line structure, the present method can be used to form the gate contact.

Figure 5:
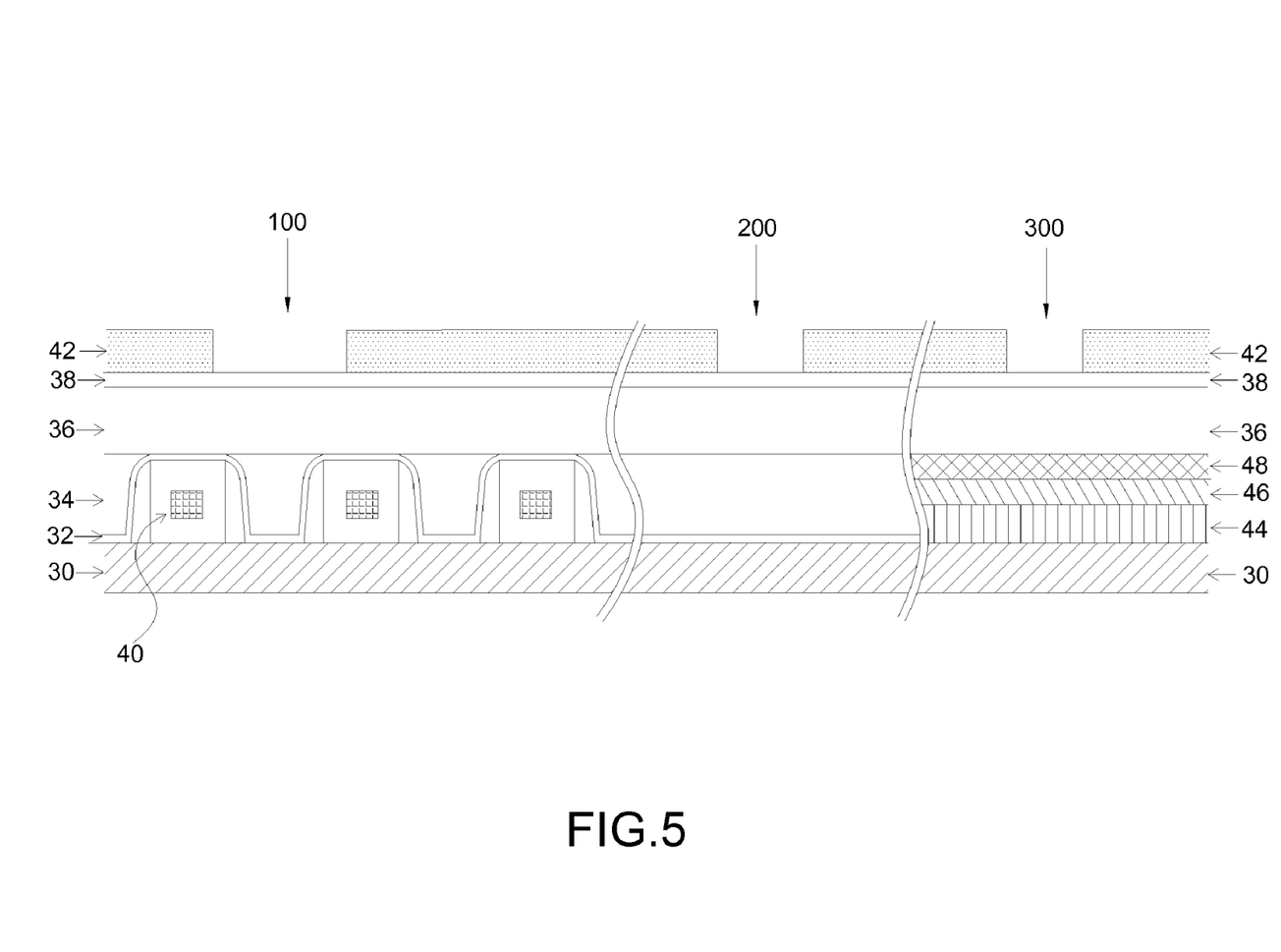
FIGS. 5-14 are flowcharts, in cross-sectional views, illustrating the process of manufacturing a contact structure of a DRAM in accordance with one embodiment of the present invention.
Figure 6:
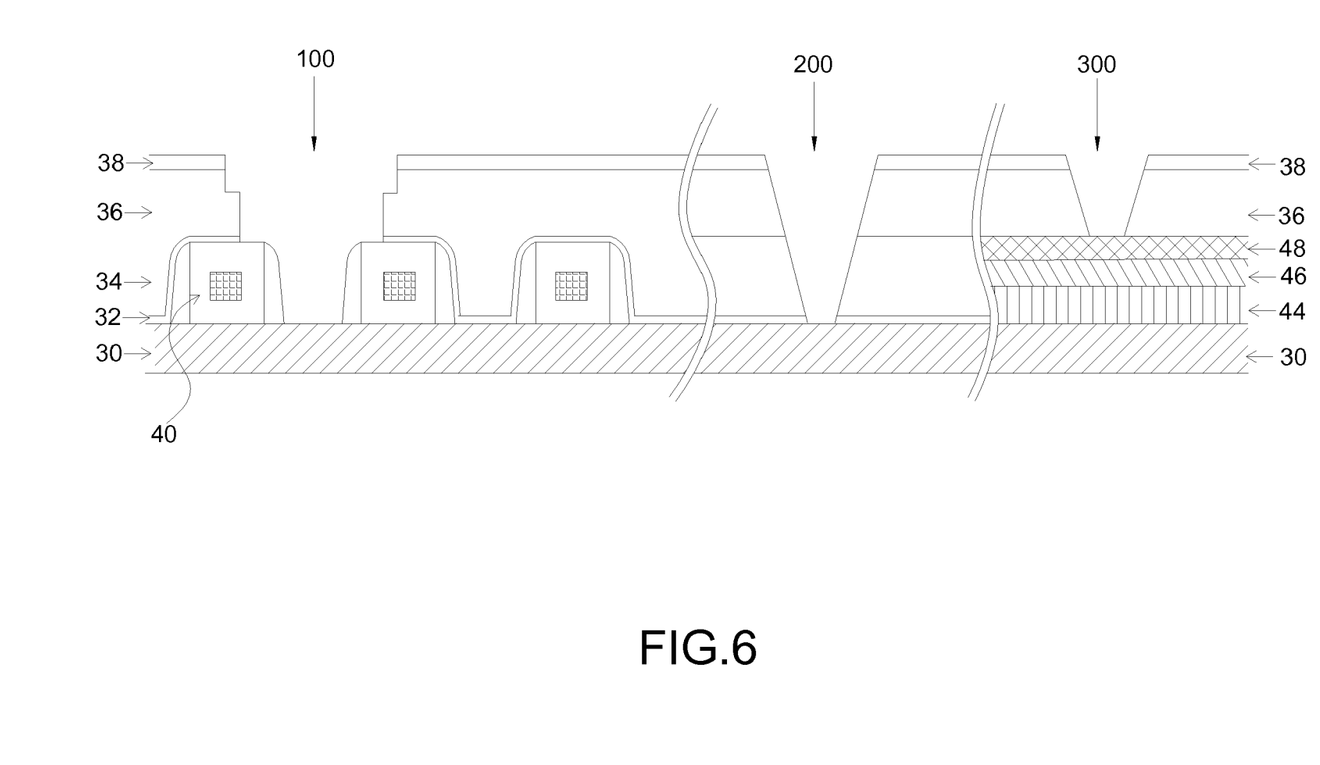

FIGS. 5-14 are flowcharts, in cross-sectional views, illustrating the process of manufacturing a contact structure of a DRAM in accordance with one embodiment of the present invention, which includes forming a bit-line contact hole 100, a substrate contact hole 200, and a gate contact hole 300, etc. Referring to FIG. 5, a plurality of transistors 40 are formed in a region near the bit-line contact hole 100 on the substrate 30, and a gate conductive layer 44, a gate metal layer 46, and a cap nitride layer 48 are formed sequentially in a region near the gate contact hole 300 on the substrate 30. For example, the gate conductive layer 44 can be a polysilicon layer, and the gate metal layer 46 can be a tungsten silicide layer. Next, an insulating nitride layer 32 is conformally formed in a region near the bit-line contact hole 100 and the substrate contact hole 200. Then, a first insulating layer 34 is deposited on the insulating nitride layer 32, and then planarized to expose the surface of the insulating nitride layer 32 by such as chemical mechanical polishing (CMP) process. For example, the insulating nitride layer 32 can be a nitride silicon layer, and the first insulating layer 34 can be a BPSG layer with a thickness between about 2700 nm and 3300 nm.

Then, a second insulating layer 36 is deposited on the substrate 40. For example, the second insulating layer 36 can be tetraethoxysilane (TEOS) and has a thickness between about 2700 nm and 3300 nm. The thickness of the photoresist layer is about 5000 Å in the 220 nm process node, but is only about 2600 Å in 110 nm process node, which is not thick enough for the following process steps. Therefore, a polysilicon layer 38 is formed on the second insulating layer 36, which functions as a hard mask and has a thickness between about 800 Å and 1200 Å. Subsequently, the desired locations of the bit-line contact hole 100, the substrate contact hole 200, and the gate contact hole 300 are defined by a first photoresist layer 42.

Next, openings in the polysilicon layer 38 are formed simultaneously through etching, and then the second etching is performed by using the polysilicon layer 38 as a hard mask, which consumes about 500 Å of the polysilicon layer 38. The structure shown in FIG. 6 can be obtained after removing the first photoresist layer 42. The openings can reach the substrate 30 in the regions of the bit-line contact hole 100 and the substrate contact hole 200, but can only reach the cap nitride layer 48, not the gate metal layer 46, in the region of the gate contact hole 300 because the cap nitride layer 48 functions as an etching stop layer. To make the opening in the region of the gate contact hole 300 reach the gate metal layer 46, another etching step is performed for the gate contact hole 300.

Figure 7:
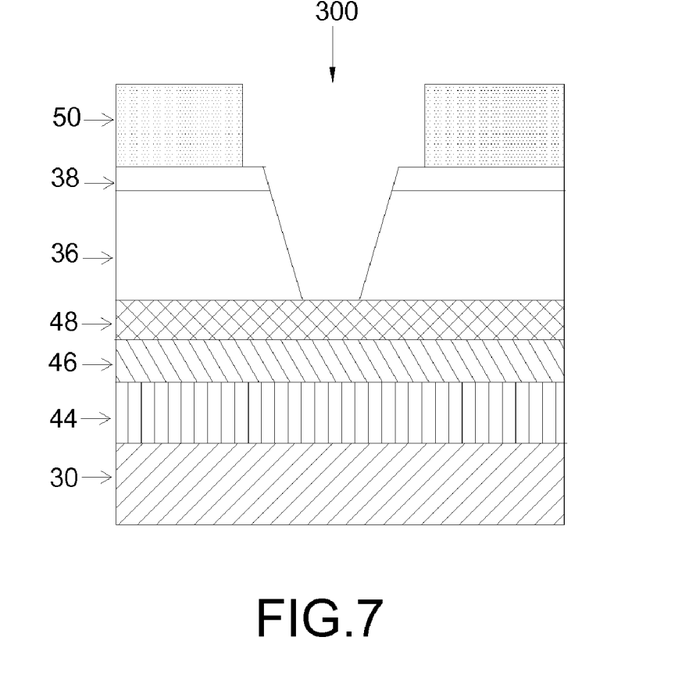
Figure 8:
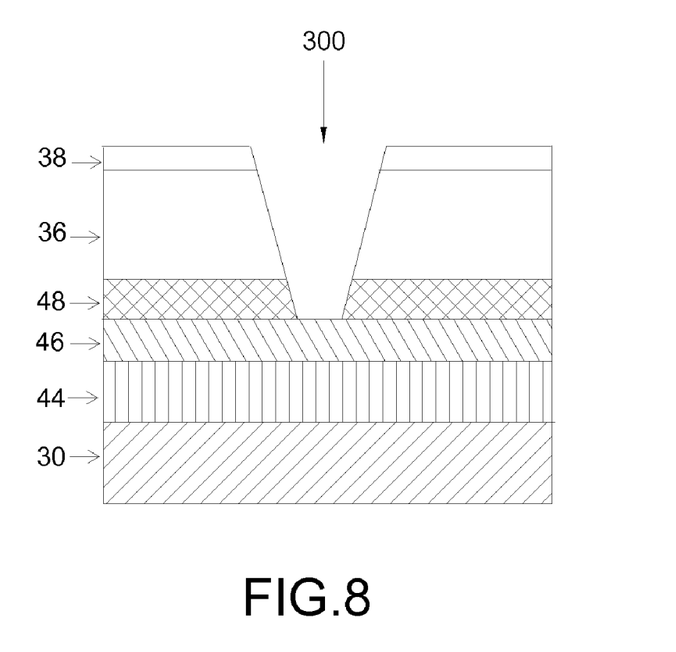

Referring to FIG. 7, a second photoresist layer 50 is formed on the polysilicon layer 38 to define the desired location of the gate contact hole 300, in which the bit-line contact hole 100 and the substrate contact hole 200 are covered by the second photoresist layer 50 (not shown). The gate contact hole 300 is then etched to reach the gate metal layer 46, and then the second photoresist layer 50 is removed, as shown in FIG. 8. This etching step consumes about 100 Å of the polysilicon layer 38.

Figure 9:
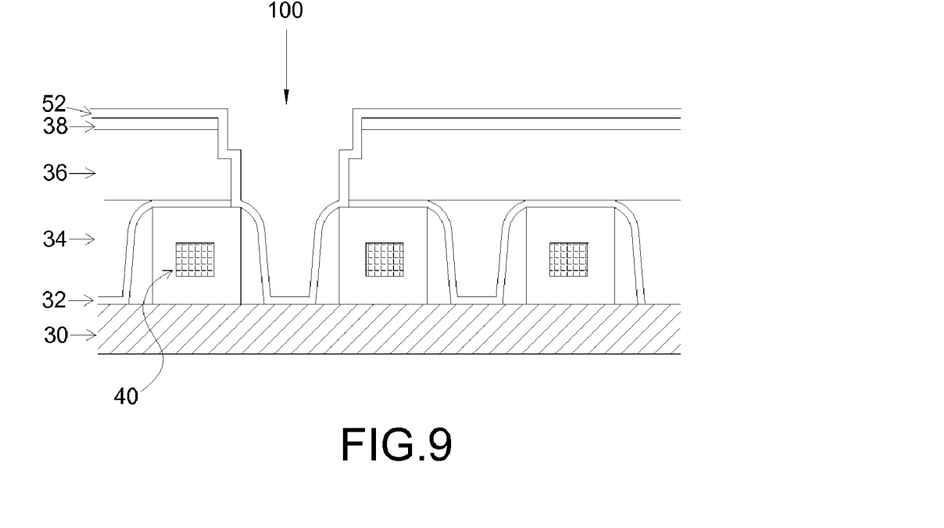

FIGS. 9-14 illustrate the diagrams of the bit-line contact hole 100, in which although the substrate contact hole 200 and the gate contact hole 300 are not shown, the same process steps are performed on them. After forming the bit-line contact hole, the substrate contact hole, and the gate contact hole, a titanium layer 52 is conformally formed on the inner surfaces of the above contact holes and the polysilicon layer 38, as shown in FIG. 9. The method of forming the titanium layer 52 can be an ion metal plasma deposition process, for example.

Figure 10:
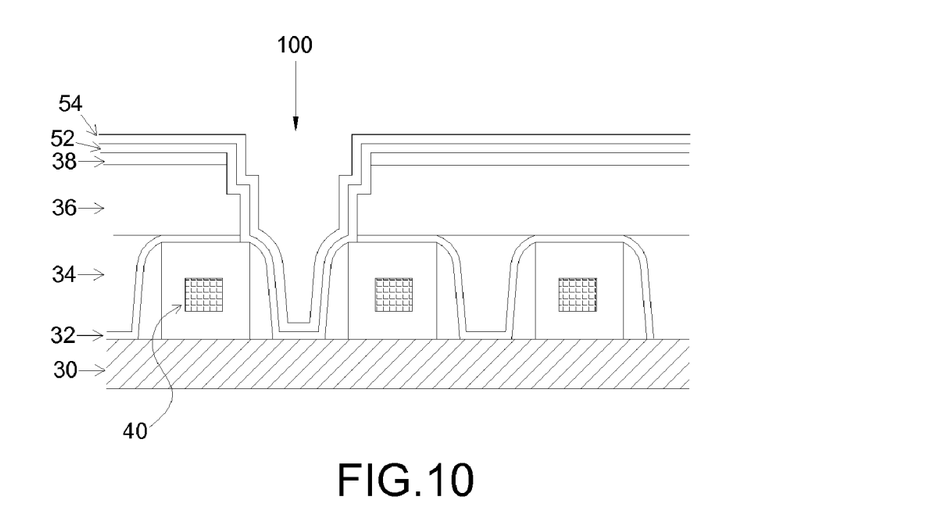
Figure 11:
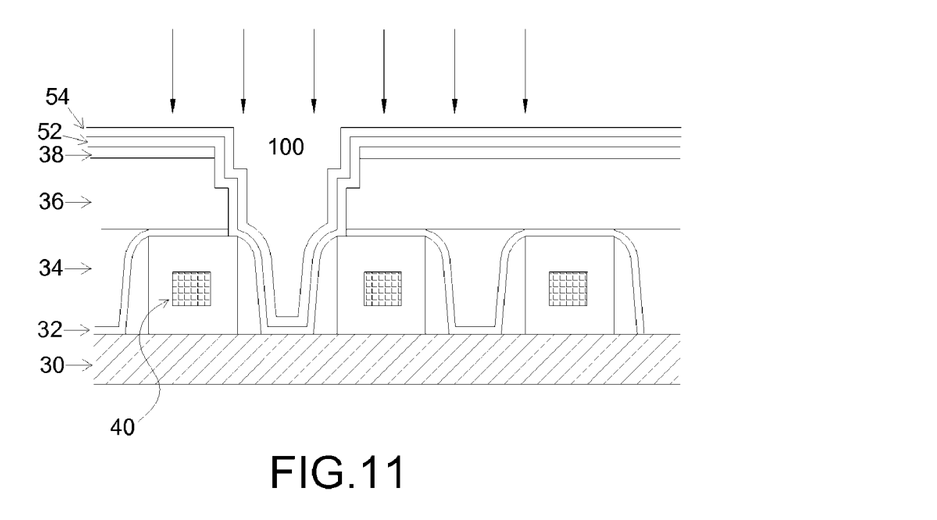
Figure 12:
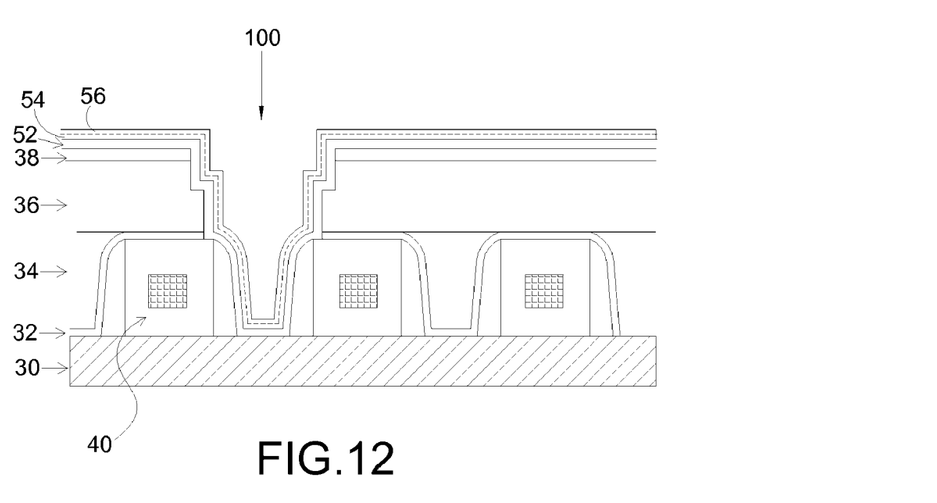
Figure 13:
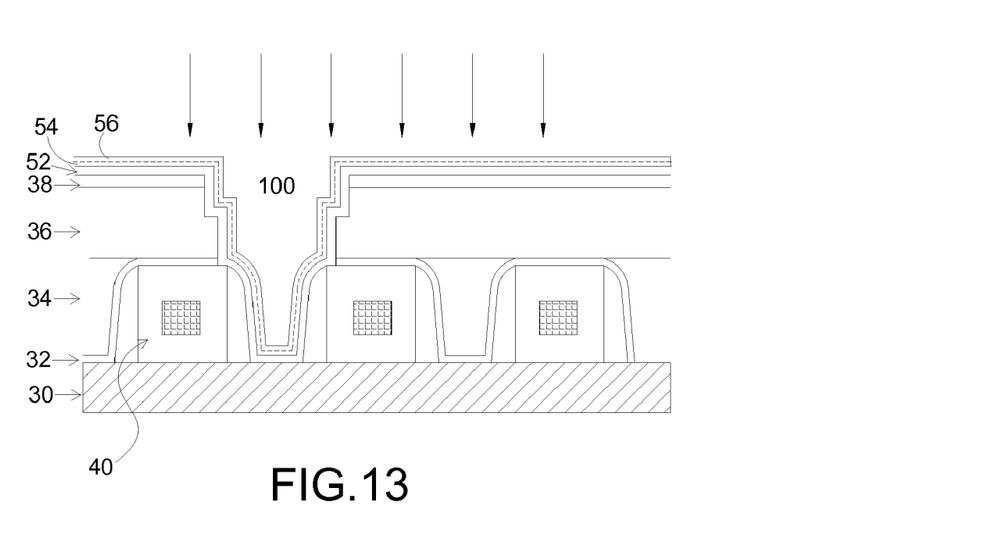

Referring to FIG. 10, a titanium nitride layer 54 is conformally formed on the titanium layer 52 by, for example, a metal-organic chemical vapor deposition (MOCVD) process. The thickness of the titanium nitride layer 54 is between about 40 Å and 60 Å. As shown in FIG. 11, a plasma process is performed on the titanium nitride layer 54 to remove impurities (such as carbon) which may be implanted into the titanium nitride layer 54 during the deposition. The plasma source gas used in the plasma process can include $O_2$ and/or $O_3$, for example. Then, another titanium nitride layer 56 is conformally deposited on the titanium nitride layer 54, as shown in FIG. 12. The plasma process is performed again on the titanium nitride layer 56 to remove the impurities thereof, as shown in FIG. 13. The steps shown in FIGS. 12 and 13 can be repeated for any given times, according to applications, until the desired thickness of the titanium nitride layer is achieved. After the last plasma process, an anneal process can be performed to repair the lattice defects caused by the plasma process.

Figure 14:
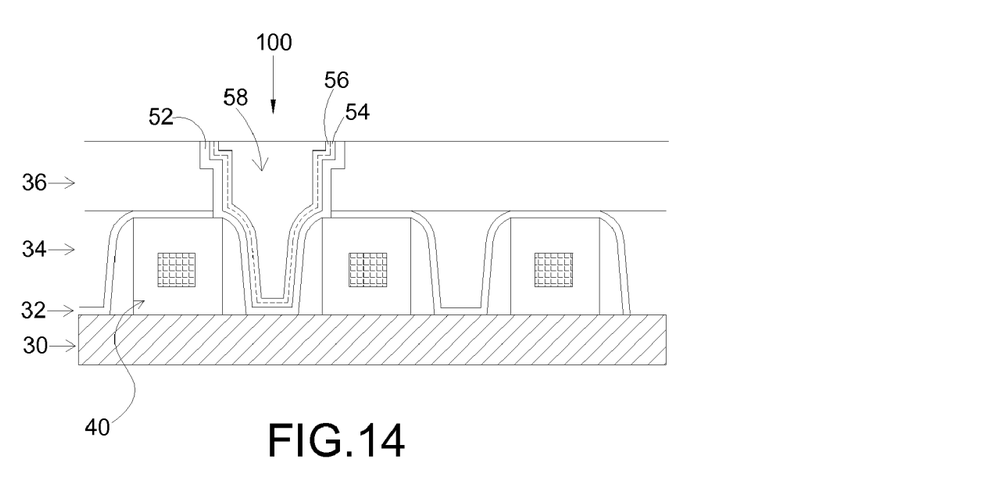

Then, referring to FIG. 14, a conductive layer 58, such as a tungsten layer, is formed on the titanium nitride layer 56 to fill these contact holes. The conductive layer 58 is then planarized to expose the surface of the second insulating layer 36 by, for example, CMP process. Since the impurities in the titanium nitrides 54 and 56 have been removed by the plasma processes, the ohmic contact between the conductive layer 58 and the titanium nitrides 54, 56 is improved. Therefore, an improved electrical contact also exists between the conductive layer 58 and the source/drain (not shown) of the transistor 40.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. A method of manufacturing a contact structure to avoid open issue, the method comprising the following steps:
   providing a substrate having a contact region;
   forming an insulating layer to cover the substrate;
   forming a polysilicon layer on the insulating layer;
   forming a contact hole in the polysilicon layer and the insulating layer to expose the contact region;
   conformally depositing a titanium layer on the polysilicon layer and the contact hole;

conformally depositing a first titanium nitride layer on the titanium layer;

performing a plasma process on the first titanium nitride layer;

conformally depositing a second titanium nitride layer on the first titanium nitride layer;

performing the plasma process on the second titanium nitride layer; and performing an anneal process.

2. The method of claim 1, wherein the step of depositing the titanium layer comprises:

depositing the titanium layer by an ion metal plasma deposition process.

3. The method of claim 1, wherein the step of depositing the first titanium nitride layer comprises:

depositing the first titanium nitride layer by a metal-organic chemical vapor deposition (MOCVD) process.

4. The method of claim 1, wherein the plasma process comprises using a plasma source gas, and the plasma source gas comprises $O_2$ or $O_3$.

5. The method of claim 1, wherein a thickness of the first titanium nitride layer and the second titanium nitride layer is between 40 Å and 60 Å.

* * * * *